United States Patent
Brauers et al.

[11] Patent Number: 6,021,173
[45] Date of Patent: Feb. 1, 2000

[54] X-RAY APPARATUS WITH SENSOR MATRIX

[75] Inventors: Andreas Brauers, Aachen, Germany; Rudolf Kemner, Eindhoven, Netherlands; Ulrich Schiebel; Herfried K. Wieczorek, both of Aachen, Germany

[73] Assignee: U.S. Philips Corporation, New York, N.Y.

[21] Appl. No.: 09/050,486

[22] Filed: Mar. 30, 1998

[30] Foreign Application Priority Data

Apr. 2, 1997 [EP] European Pat. Off. .............. 97200962

[51] Int. Cl.[7] ...................................................... H05G 1/64
[52] U.S. Cl. ....................................... 378/98.8; 250/370.9
[58] Field of Search ................................... 378/98.8, 154, 378/155; 250/370.09

[56] References Cited

U.S. PATENT DOCUMENTS

| | | | |
|---|---|---|---|
| 3,912,933 | 10/1975 | Van Stappen | 250/475 |
| 5,352,896 | 10/1994 | Brown | 250/368 |
| 5,380,636 | 1/1995 | Malfatto et al. | 430/503 |
| 5,396,072 | 3/1995 | Schiebel et al. | 250/370.09 |
| 5,666,395 | 9/1997 | Tsukamoto et al. | 378/98.4 |
| 5,693,947 | 12/1997 | Morton | 250/370.09 |
| 5,729,021 | 3/1998 | Brauers et al. | 250/370.09 |

FOREIGN PATENT DOCUMENTS

| | | | |
|---|---|---|---|
| 0403802A2 | 12/1990 | European Pat. Off. | H01J 1/62 |
| 0767389A2 | 4/1997 | European Pat. Off. | G01T 1/29 |
| 2505230 | 8/1976 | Germany | G03C 1/92 |
| 55-159540A | 12/1980 | Japan | H01J 9/227 |
| 09075332A | 3/1997 | Japan | A61B 6/00 |
| 2244328A | 11/1991 | United Kingdom | G01T 1/20 |

*Primary Examiner*—David P. Porta
*Assistant Examiner*—Michael J. Schwartz
*Attorney, Agent, or Firm*—Dwight H. Renfrew

[57] ABSTRACT

An x-ray examination apparatus comprises an x-ray detector with a sensor matrix for deriving an image signal from an x-ray image. The x-ray detector is provided with a scatter grid having a regular pattern of x-ray attenuating partitions. The spatial resolution of the sensor matrix is such that the size of the smallest detectable detail in the x-ray image is larger than the distance between adjacent partitions. In particular the x-ray detector comprises an x-ray sensitive photoconductor layer for converting x-rays into electric charges, separate sensor elements include respective collecting electrodes and a semiconductor cladding layer being disposed between the photoconductor layer and the collecting electrodes. The semiconductor cladding layer has a substantial lateral electric conductivity. For example, the semiconductor cladding layer is a chlorine doped selenium layer, or a selenium, sulphur or telluride doped lead-oxide layer.

15 Claims, 3 Drawing Sheets

X-RAY APPARATUS WITH SENSOR MATRIX

The invention relates to an x-ray examination apparatus comprising an x-ray detector an x-ray detector with a sensor matrix for deriving an image signal from an x-ray image.

Such an x-ray detector is known from the European patent application EP 0 588 397. The sensor matrix has a plurality of sensor elements arranged in columns and rows. The known x-ray detector comprises a common electrode and separate sensor elements including respective collecting electrodes. Between the common electrode and the collecting electrodes there is provided a photoconductor layer. Each column is provided with a read-out line coupled to a low-noise amplifier. The outputs of the low-noise amplifiers are coupled to a multiplex circuit. The photoconductor layer of the known sensor matrix consists of amorphous selenium ($\alpha$-Se). Incident x-radiation is absorbed in the photoconductor layer and generates electron-hole pairs. Under the influence of a static electrical field which is applied across the photoconductor layer by way of the common electrode, the holes migrate to the common electrode and the electrons are collected at the collecting electrodes, or vice versa depending on the polarity of the static electric field, holes are collected at the collecting electrodes and electrons migrate to the common electrode. Each collecting electrode is part of a collecting capacitance. Separate sensor elements comprise respective switching elements which couple the relevant collecting electrode to one of the read lines. The switching elements, which remain opened during x-irradiation, are closed to read out the collected electric charges which are supplied to the respective read-lines along which they flow to respective low-noise amplifiers which integrate the current in the respective read-lines and subsequently supply a charge signal to the multiplex circuit which converts the charge signals of respective read-lines into an electronic image signal.

To form the x-ray image, an object such as a patient who is to be radiologically examined, is irradiated with x-rays. Owing to local variations of the x-ray absorption in the object the x-ray image is formed on the sensor matrix. Some of the x-rays are scattered in the patient, e.g. due to Compton scattering. The scattered x-rays perturb the x-ray image. Notably, the scattered x-rays cause a veiling-like perturbation of the x-ray image which deteriorates the rendition of small details in the x-ray image.

An object of the invention is to provide an x-ray examination apparatus comprising a sensor matrix and in which perturbations of the x-ray image related to scattered x-rays are substantially avoided.

This object is achieved by an x-ray examination apparatus according to the invention which is characterized in that the x-ray detector is provided with a scatter grid having a regular pattern of x-ray attenuating partitions and the spatial resolution of the sensor matrix is such that the size of the smallest detectable detail in the x-ray image is larger than the distance between adjacent partitions.

The x-ray attenuating partitions of the scatter grid substantially block scattered x-rays and avoid that the scattered x-rays reach the sensor matrix. The x-ray attenuating partitions form channels which are essentially parallel to the direction of the x-rays that are not scattered so that the scatter grid allows the non-scattered x-rays to reach the sensor matrix.

If no further steps are taken, the periodic structures of respectively the regular pattern of the partitions of the scatter grid and the regular pattern of the matrix of sensor elements will cause Moiré-like perturbations. Such Moiré-like perturbations are caused by interference of the periodic pattern of the scatter grid with the periodic pattern of the sensor elements of the sensor matrix. The spatial resolution of the sensor matrix is a dimensionless quantity that is inversely proportional to the smallest separately detectable detail in the x-ray image. Hence, the smaller the smallest detectable detail, the higher the spatial resolution of the sensor matrix. Because the spatial resolution of the sensor matrix is so low that the size of the smallest feature that the sensor matrix is able to detect separately is larger than the size of the channels of the scatter grid, Moiré-like perturbations are avoided. Notably, it is achieved that the difference between the spatial frequency of the regular pattern of x-ray attenuating partitions and the effective spatial frequency of the sensor elements is substantially larger than the spatial frequency of relevant details in the x-ray image. Preferably, the spatial resolution is such that the size of the smallest feature that the sensor matrix is able to detect separately, is larger than about half the size of the channels of the scatter grid. The x-ray examination apparatus according to the invention is able to generate x-ray image with a high diagnostic quality, that is small details having low contrast in the x-ray image can be rendered well visible.

Employing a scatter grid to reduce perturbations in the x-ray image due to scattered x-rays is known per se from the U.S. Pat. No. 5,270,925.

A preferred embodiment of an x-ray examination apparatus wherein the sensor matrix includes an x-ray sensitive layer, according to the invention is characterized in that the x-ray sensitive layer is arranged so that the spatial resolution of the sensor matrix is such that the size of the smallest detectable detail in the x-ray image is larger than the distance between adjacent partitions.

The x-ray sensitive layer causes some spread in electric charges or low-energy radiation which is generated by incident x-rays. In particular it is achieved that the x-ray sensitive layer reduces the spatial resolution of the sensor matrix such that the smallest detail that the sensor matrix can detect separately is larger than the distance between adjacent partitions of the scatter grid, preferably larger than half the distance between adjacent partitions.

A preferred embodiment of an x-ray examination apparatus wherein the x-ray sensitive layer is a photoconductor layer for converting x-rays into electric charges, the sensor matrix includes separate sensor elements having respective collecting electrodes and a semiconductor cladding layer being disposed between the photoconductor layer and the collecting electrodes according to the invention is characterized in that the semiconductor cladding layer has a substantial lateral electric conductivity, so that the spatial resolution of the sensor matrix is such that the size of the smallest detectable detail in the x-ray image is larger than the distance between adjacent partitions.

Incident x-rays generate electron-hole pairs in the photoconductor layer. Charge carriers of one type, electrons or holes, are collected in the collecting electrodes and the image signal is derived from the collected electric charges. The electric charges of opposite polarity to the collected electric charges are carried-off to a common opposing electrode and subsequently recombined. The substantial lateral electric conductivity of the semiconductor cladding layer causes the collected electric charges to spread to some extend parallel to the semiconductor cladding layer. Hence, the spatial resolution of the sensor matrix is reduced so that Moiré-like perturbations due to the scatter grid are substantially avoided.

A preferred embodiment of an x-ray examination apparatus wherein the photoconductor layer is a selenium layer according to the invention is characterized in that the semiconductor cladding layer is a chlorine doped selenium layer.

Doping the selenium semiconductor cladding layer with about 80–120 ppm, preferably about 100 ppm chlorine causes the lateral electric conductivity to be such that the smallest feature that the sensor matrix can detect is larger than about half the distance between partitions of the scatter grid. The chlorine doped selenium semiconductor cladding layer contains hardly any arsenic and has a crystalline structure. In contrast, the selenium photoconductor layer has an amorphous structure. It appears that arsenic terminates the build-up of selenium chains and thus counteracts the crystallisation of selenium. Crystalline selenium has a much higher electrical conductivity than amorphous selenium. Thus, a crystalline selenium layer is a suitable semiconductor cladding layer with lateral electrical conductivity.

A preferred embodiment of an x-ray examination apparatus wherein the photoconductor layer is a lead-oxide layer according to the invention is characterized in that the semiconductor cladding layer having a substantial electrical conductivity is a non-stoichiometric lead-oxide layer or a lead-oxide layer doped with an element from the group selenium (Se), sulphur (S), tellurium (Te).

The non-stoichiometric lead-oxide semiconductor cladding layer containing a relative excess of oxygen has a substantial lateral electric conductivity for holes. The non-stoichiometric lead-oxide semiconductor cladding layer containing a relative deficiency of oxygen has a substantial lateral electric conductivity for electrons. In the event holes are collected at the collecting electrodes the spatial resolution of the sensor matrix is reduced by the non-stoichiometric lead-oxide semiconductor cladding layer having a relative excess of oxygen. In the event electrons are collected at the collecting electrodes the spatial resolution of the sensor matrix is reduced by the non-stoichiometric lead-oxide semiconductor cladding layer having a relative deficiency of oxygen. As an alternative a desired lateral electrical conductivity is achieved by doping the lead-oxide semiconductor cladding layer with selenium, sulphur or telluride so as to achieve that the spatial resolution of the sensor matrix is so low that the smallest detectable detail in the x-ray-image has a size larger than about half the distance between the partitions of the scatter grid.

A preferred embodiment of an x-ray examination apparatus according to the invention is characterized in that the x-ray sensitive layer is a conversion layer for converting x-rays into low-energy radiation and the conversion layer being arranged so that the spatial resolution of the sensor matrix is such that the size of the smallest detectable detail in the x-ray image is larger than the distance between adjacent partitions.

The low-energy radiation, for example green or red light is detected by photo-electric elements such as photodiodes which are incorporated in the sensor elements. The photo-electric elements convert the low-energy radiation into electric charges. These electric charges are read-out and the image signal is derived from the read-out electric charges. The conversion layer is arranged such that there is some lateral spread of the low-energy radiation in the conversion layer parallel to the conversion layer. Thus the spatial resolution is reduced so that Moiré-like perturbations in the x-ray image due to the scatter grid are substantially avoided.

A preferred embodiment of an x-ray examination apparatus according to the invention is characterized in that the x-ray sensitive layer is a caesium-iodide layer including columnar crystals, the structure of the columnar crystals being arranged so that the spatial resolution of the sensor matrix is such that the size of the smallest detectable detail in the x-ray image is larger than the distance between adjacent partitions.

The caesium-iodide layer has groups of columnar crystals, the columns being substantially transverse to the conversion layer and which effectively act as light-channels for the low-energy radiation. The caesium-iodide is preferably doped with some thallium so that x-rays are converted in green light for which the photo-electric elements are sensitive. There are separations like cracks between the groups of columnar crystals. Typically there are at most 200–400 of such cracks per centimeter. The structure of the groups of columnar crystals, notably the distribution of the cracks causes the spatial resolution of the sensor matrix to be such that Moiré-like perturbations due to the scatter grid are substantially avoided. Such a structure of the columnar crystals is achieved when the caesium-iodide is disposed on a substrate at a temperature in the range of about 200–250° C. As an alternative the substrate temperature is lower, in the range of 120–180° C. and subsequently the caesium-iodide layer is annealed at an elevated temperature preferably in the range of about 200–250° C.

A preferred embodiment of an x-ray examination apparatus according to the invention is characterized in that the thickness of the conversion layer is arranged so that the spatial resolution of the sensor matrix is such that the size of the smallest detectable detail in the x-ray image is larger than the distance between adjacent partitions.

The thicker the conversion layer, the more the low-energy radiation is spread laterally, i.e. parallel to the conversion layer. Due to the lateral spread of the low-energy radiation the spatial resolution of the sensor matrix is reduced. In particular when the caesium-iodide conversion layer is thicker than about 500 $\mu$m the spatial resolution of the sensor matrix is reduced to such an extent that Moiré-like perturbations due to the scatter grid are substantially avoided. The thicker the conversion layer, the higher the sensitivity of the x-ray detector. That is, at substantially constant intensity and energy of the incident x-rays, the signal level of the image signal is higher as a thicker conversion layer is employed. Preferably, the thickness of the caesium-iodide layer is in the range 500–1000 $\mu$m.

A preferred embodiment of an x-ray examination apparatus according to the invention is characterized in that the sensor matrix includes a conversion layer for converting x-rays into low-energy radiation and the sensor matrix is provided with a diffusive reflector layer on the face of the conversion layer facing the scatter grid.

The low-energy radiation generated by the incident x-rays in the conversion layer is emitted not only in the direction towards the photo-electric elements, but to a substantial extent also in the opposite direction. The diffusive reflector reflects the low-energy radiation that has been emitted in the direction away from the photo-electric elements. The propagation direction of the reflected low-energy radiation has a component towards the photo-electric elements, so that the reflected low-energy radiation reaches the photo-electric elements, such as photodiodes. The propagation direction of a substantial portion of the reflected low-energy radiation also has a component parallel to the conversion layer. Thus a substantial portion of the reflected low-energy radiation is to some extent spread laterally so that the spatial resolution of the sensor matrix is reduced. The diffusive reflector layer reduces the spatial resolution of the sensor matrix such that the smallest detail that can be detected separately is smaller than the distance, preferably smaller than half the distance, between the partitions of the scatter grid. Thus, Moiré-like perturbations due to the scatter grid in the x-ray image are substantially avoided. Particular good results are achieved with a titanium-oxide diffusive reflector layer.

In addition, the diffusive reflector layer enhances the sensitivity of the x-ray detector. These and other aspects of the invention will be elucidated with reference to the embodiments described hereinafter and with reference to the accompanying drawing wherein

BRIEF DESCRIPTION OF THE DRAWINGS

FIG. 1 shows a circuit diagram of a sensor matrix 1 incorporated in an x-ray detector of an x-ray examination apparatus according to the invention. The sensor matrix incorporates a plurality of sensor elements arranged in a matrix. For each pixel in the x-ray image there is provided a sensor element 21 which comprises a photo-electric element 22, a collecting capacitance 23 and a switching element 4. Electric changes are derived from incident x-rays by the photo-electric element 22, which electric charges are collected by the collection capacitance 23. The collecting electrodes 3 form part of respective collecting capacitances 23. For each column of sensor elements there is provided a respective read-lines 19 and each collecting capacitance 23 is coupled to its respective read-line 19 by way of its switching element 4. Although as an example FIG. 1 shows only 3×3 sensor elements, in a practical embodiment a much larger number of sensor elements say 2000×2000, is employed. The photo-electric elements are formed as a continuous lead-oxide photoconductor layer between the collecting electrodes 3 and the common electrode 2 and covering the entire image area. Incident x-rays are absorbed in the photoconductor layer 6 and electron-hole pairs are generated in the photoconductor layer. Under the influence of an electric field, having a field strength for instance in the range of 1V/mm to 20V/mm, which is applied across the photoconductor layer by means of the collecting electrodes and the common electrode which function as cathode and anode, the electrons move to the anode and the holes move to the cathode. Hence, electric charges are collected at the collecting electrodes as a consequence of absorption of x-rays. The common electrode is for example an thin metal layer having a thickness in the range of 100 nm to 1 µm, and preferably in the range between 100 nm and 200 nm. A metal layer having a thickness in this preferred range combines good adhesion to the layer onto which it is disposed and is comparatively dense so as to have a relatively low electrical resistance. Moreover, such layers are cheap, even if an expensive metal is used, since a relatively small amount of material is required. Suitable metals for constituting the common electrode are for example Au,Al,Ag,Pt,Pd etc. and also indium-tin oxide ($In_ySn_{1-y}O_x$ (0<2, 0<y<1)) is a suitable conductor for forming the common electrode.

Figure 1:
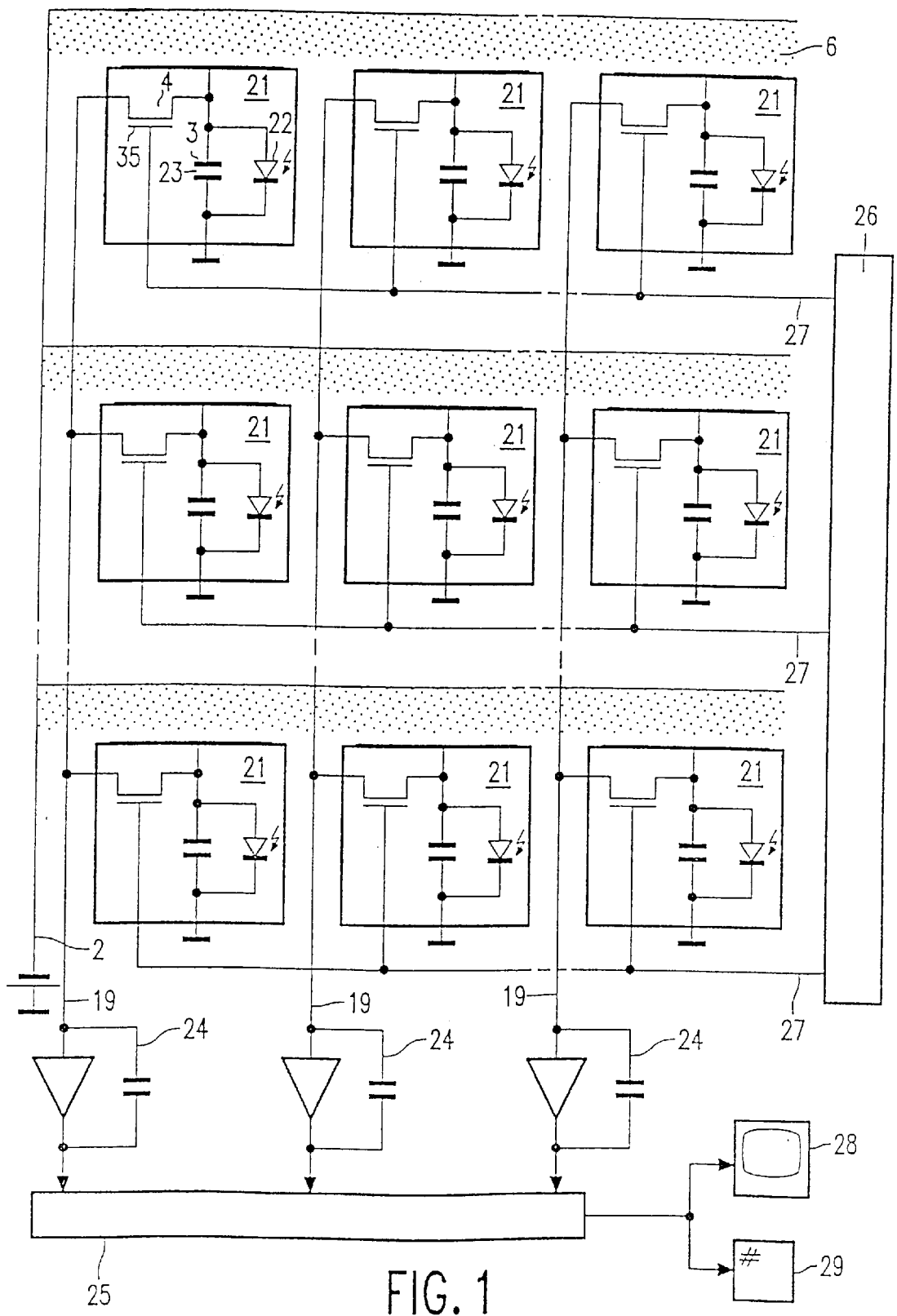
FIG. 1 shows a circuit diagram of a sensor matrix incorporated in an x-ray detector of an x-ray examination apparatus according to the invention.

In order to read-out the collected electric charges the relevant switching elements 4 are closed so as to pass electric charges down respective read-lines. Separate read-lines 19 are coupled to respective highly sensitive output amplifiers 24 of which the output signals are supplied to a multiplex circuit 25. The electronic image signal is composed from the output signals by the multiplex circuit 25. The switching elements 4 are controlled by means of a row-driver circuit 26 which is coupled to the switching elements for each row by means of addressing lines 27. The switching elements 4 are preferably formed as thin-film transistors (TFT) of which the drain contact is connected to a relevant read-line, the source contact is connected to the relevant collecting electrode and the gate contact is coupled to the relevant addressing line. The multiplex circuit supplies the electronic image signal e.g. to a monitor 28 on which the image information of the x-ray image is then displayed or the electronic image signal may be supplied to an image processor 29 for further processing.

Figure 2:
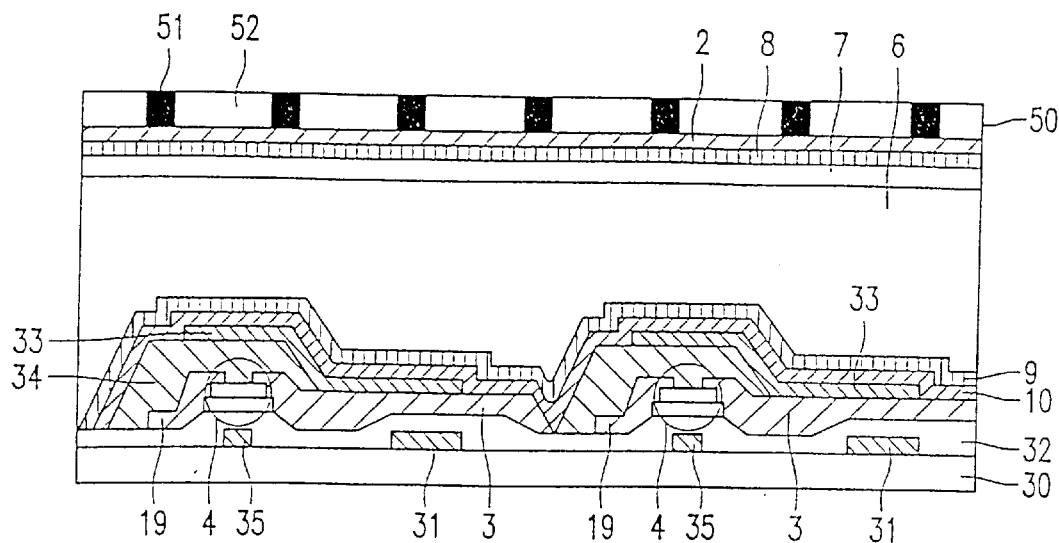
FIG. 2 shows an embodiment of such an x-ray detector in cross-sectional view.

FIG. 2 shows an x-ray detector in cross-sectional view. FIG. 2 notably shows a thin-film structure of an x-ray detector incorporated in an x-ray examination apparatus according to the invention in cross-sectional view. On a substrate 30, e.g. a glass plate there is disposed a metal, e.g. aluminium, patterning comprising the read lines 19 and counter-electrodes 31. A dielectric separating layer 32 covers said metal patterning. The collecting electrodes 3 together with the counter-electrodes 31 form the collecting capacitances 23. On the dielectric separating layer 32 there are disposed the collecting electrodes 3 that are located substantially above the respective counter electrodes 31 and extend to the thin-film transistor 4. In the embodiment of FIG. 2, the thin-film transistor 4 is in fact a field effect transistor consisting of a multilayer structure of differently doped semiconductor layers so that a channel is formed from the collecting electrode 3 to the read-line 19. The conductivity of the channel is influenced by the voltage at the gate-contact 35 which is electrically coupled to a respective addressing line. To achieve adequate conductivity the read-lines 5 have a width of 10 µm to 25 µm. The collecting electrode 3 is optionally provided with an electrode-extension 33 in the form of a metal layer disposed on the collecting electrode and which is separated from the thin-filmtransistor by a insulating layer 34. The electrode-extensions serve to increase the effective area of the collecting electrode for collecting electric changes. The collecting electrode 3 and the electrode extensions 33 are for example formed as thin metal, gold or aluminium, layers having a thickness in the range from 0.2 µm to 1 µm. In order to avoid that parasitic capacitances may disturb the reading-out of collected electric charges, the insulating layer 34 should have a thickness of at least 3 µm, preferably, the thickness is in the range between 5 µm and 10 µm.

The photoconductor layer 6 is formed as a polycrystalline lead-oxide ($PbO_x$, 0<x<2) layer having a thickness of 30–500 µm, which has a high sensitivity for x-radiation and which allows rapid charge transport to the collecting electrodes 3 without substantial loss. Very good results are in this respect obtained with a lead-oxide photoconductor layer having a stoichiometric composition (PbO, i.e. x=1).

The semiconductor cladding layer 9 separates the photo-conductor layer from the collecting electrodes 3 and the electrode extensions 33. The semiconductor cladding layer 9 provides a bias contact between the collecting electrodes and the photoconductor layer. Preferably, the semiconductor cladding layer 9 is formed as a thin $PbO_x$-layer with a thickness in the range of 0.1 µm to 1 µm. When the collecting electrodes function as anode, i.e. when a positive voltage is supplied to the collecting electrodes an excess of oxygen (x>1), relative to the stoichiometric composition, is incorporated in the semiconductor cladding layer 9. When the collecting electrodes act as cathodes, i.e. a negative voltage is supplied to the collecting electrodes then the semiconductor cladding layer 9 is composed so as to show a lack of oxygen relative to stoichiometric composition (x<1). These respective compositions achieve the desired bias contact between the collecting electrodes and the photoconductor layer so as to avoid charge injection from the collecting electrodes into the photoconductor layer.

Preferably, the lead-oxide semiconductor cladding layer 9 is doped with Se, S or Te so as to achieve a substantial lateral conductivity for the electric charges that are collected by the collecting electrodes 33.

Optionally, a resistive layer 10 is disposed between the sensor elements 9 and the collecting electrodes 3. Such a resistive layer causes the build-up of space charges in the portions of the photoconductor layer above the regions between the collecting electrodes. Consequently, the electric field lines in the photoconductor layer are distorted so as to direct photocharges that are generated in said portions to a adjacent collecting electrode 3. This advantageous effect is particularly effective when the collecting electrodes are not provided with electrode extensions, so that then the spacing between adjacent collecting electrodes is comparatively large. When the resistive layer 10 is disposed between the semiconductor cladding layer 9 and the collecting electrodes 3, the semiconductor cladding layer is not in direct contact with the collecting electrodes, but still functions as a blocking barrier for carriers injected from the collecting electrode.

Between the common electrode 2 and the photoconductor layer 6 there is disposed a bias layer 8 to counteract injection of electric charges from the common electrode 2 into the photoconductor layer 6. Preferably, the bias layer 8 is disposed as a semiconductor layer having a bandgap of about 1 eV to 5 eV and a dark resistance of about $10^{11}$ Ωcm.

Passivation of the lead-oxide photoconductor layer is achieved by disposing a passivation layer 7 between the common electrode and the photoconductor layer 6, notably between the photoconductor layer 6 and the bias layer 8 or between the photoconductor layer 6 and the common electrode 2. Such a separate passivation layer is preferably formed as an isolating layer having a high specific resistivity of about $10^{11}$ Ωcm and a thickness such that charge carriers that are generated in the photoconductor layer 6 due to x-ray absorption are able to cross the passivation layer 7 so as to reach the common electrode 2. The passivation layer 7 may be formed from an electrically isolating lacquer such as polyurethane or from electrically isolating resins.

The scatter grid 50 is mounted on the side of the sensor matrix at which the x-rays are incident. The scatter grid comprises x-ray absorbing partitions 51 which define channels 52 which allow non-scattered x-ray to pass. The partitions can be arranged in a regular for instance striped, square, triangular or honeycomb pattern. The channels are typically 0.18 mm wide and 1.4 mm long. The partitions are about 0.07 mm thick lead plates.

As an alternative, the photoconductor layer 6 is an amorphous selenium layer doped with 0.1%–1%. As and the semiconductor cladding layer 9 is a 20 μm thick selenium layer doped with about 100 ppm Cl. The selenium semiconductor cladding layer has a substantial crystalline structure.

Figure 3:
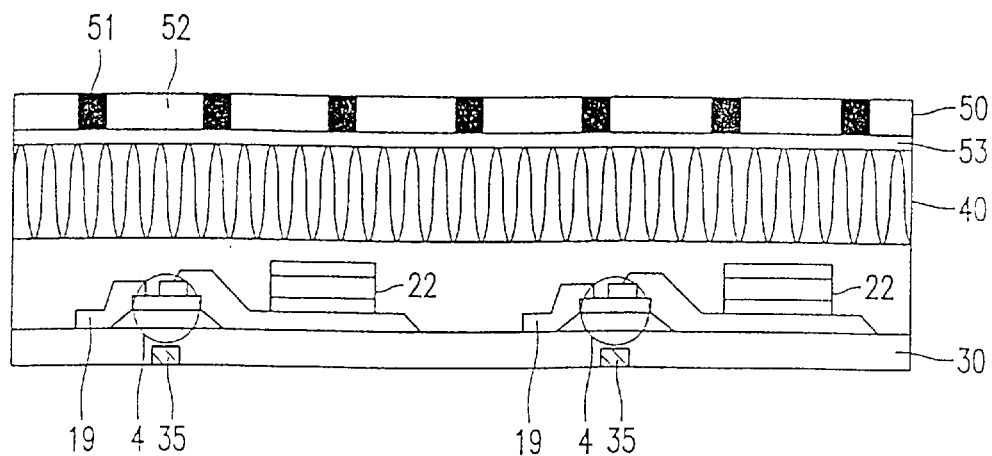
FIG. 3 shows another embodiment of such an x-ray detector in cross sectional view

FIG. 3 shows another embodiment in cross sectional view of an x-ray detector of an x-ray examination apparatus according to the invention. FIG. 3 notably shows in cross-sectional view a thin-film structure of a sensor matrix incorporated in the x-ray detector of the x-ray examination apparatus according to the invention. On the substrate 30 there are disposed the thin-film transistors 4 and photodiodes 22, which form the photo-electric elements. Notably, instead of photodiodes there may be employed semiconductor photoconducting elements or phototransistors as the photo-electric elements. In particular photodiodes have a simple structure and are therefore easy to manufacture. The photodiodes convert incident radiation such as light or infrared radiation into electric charges. In particular a pin-diode structure is suitable to form such a photodiode. The thin-film transistors 4 form switching elements which couple the photodiodes 22 to respective read-lines 19.

The x-ray sensor matrix also comprises the conversion element 50 in the form of a scintillation layer of e.g. CsI:Tl. Such a scintillation layer converts incident x-rays into green light for which the photodiodes are substantially sensitive. Preferably, the CsI:Tl is deposited in the form of columnar crystals, groups of which effectively form light-guides. Such groups of columnar crystals are separated by cracks that are distributed preferably at about 200–400 cracks per centimeter. Typically the thickness of the CsI:Tl layer is in the range 500–1000 μm.

Figure 4:
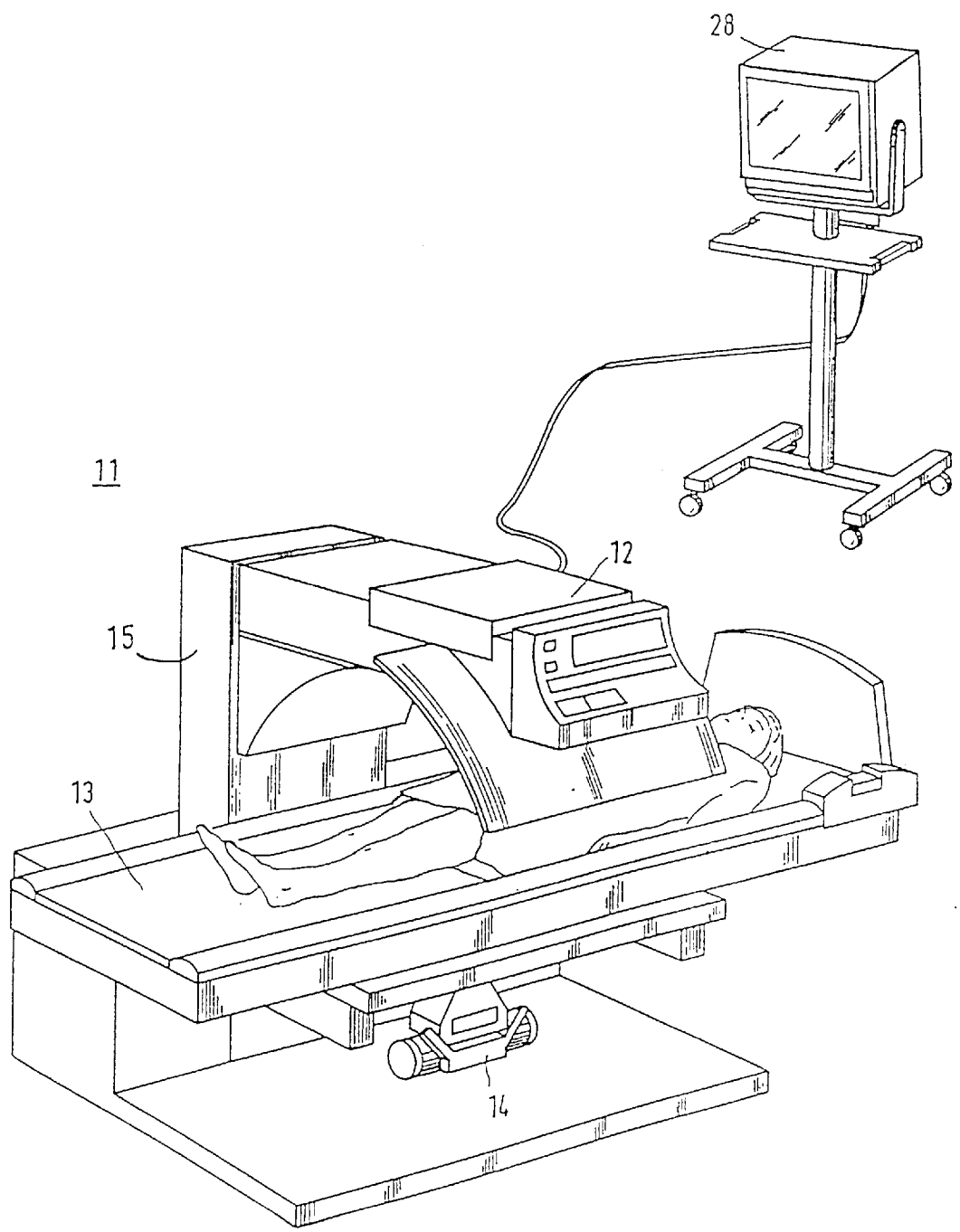
FIG. 4 shows an x-ray examination apparatus according to the invention.

On the side from which x-rays are incident on the conversion layer 40 there is provided the scatter grid 50. Between the scatter grid 50 and the conversion layer 40 the diffusive reflector layer 53, notably a titanium-oxide layer is disposed. When the diffusive reflector layer is employed, the CsI:Tl conversion layer 40 can have a thickness less than 500 μm. FIG. 4 shows an x-ray examination apparatus according to the invention. The x-ray examination apparatus comprises a patient table 13 on which a patient who is to be examined can be positioned. An x-ray source 14 is provided under the patient table. The x-ray detector 12 is mounted on a carrier 15 so that the x-ray detector faces the x-ray source. In order to produce an x-ray image, the patient is irradiated with an x-ray beam which is emitted by the x-ray source. Owing to local differences of the x-ray absorption in the patient an x-ray shadow image is formed on the x-ray detector. By the sensor matrix 1 which is incorporated in the x-detector the x-ray image is converted into an electronic image signal. The electronic image signal is supplied to the monitor 28 on which the image information of the x-ray image is displayed.

All reference cited herein are incorporated herein by reference in their entirety and for all purposes to the same extent as if each individual publication or patent or patent application was specifically and individually indicated to be incorporated by reference in its entirety for all purposes.

What is claimed is:

1. An x-ray detector for detecting an incident x-ray image produced in an x-ray examination apparatus, the x-ray detector comprising:

a planar scatter grid including a regular array of x-ray attenuating partitions, a plurality of sensor elements arranged in a planar matrix, the scatter grid being positioned over the sensor matrix for substantially blocking scattered x-rays from reaching the sensor elements, the sensor elements further comprising a continuous x-ray sensitive layer for converting incident x-rays into electric charges, and a plurality of switching elements for deriving an image signal from the electric charges, and wherein the x-ray sensitive layer causes sufficient lateral spreading of the electric charges to reduce the spatial resolution of the sensor matrix such that the size of the smallest detectable detail in an x-ray image is larger than the distance between adjacent partitions in the scatter grid, whereby Moiré-like perturbations due to the scatter grid are substantially avoided.

2. An x-ray examination apparatus comprising:

an x-ray source for producing an x-ray image by irradiating a patient to be examined with x-rays, and an x-ray detector for detecting the x-ray image, wherein the x-ray detector has the structure claimed in claim 2.

3. The detector of claim 1 wherein the switching elements further comprise electric-charge collecting electrodes, and wherein the continuous x-ray sensitive layer further comprises a photoconductor layer for converting incident x-rays into electric charges and a semiconductor cladding layer disposed between the photoconductor layer and the collecting electrodes, the semiconductor cladding layer having sufficient lateral electric conductivity between the collecting electrodes to reduce the spatial resolution of the x-ray detector so that the size of the smallest detectable detail in the x-ray image is larger than the distance between adjacent partitions in the scatter grid.

4. The detector of claim 3 wherein the photoconductor layer comprises a selenium layer, and wherein the semiconductor cladding layer comprises a chlorine doped selenium layer.

5. The detector of claim 4 wherein the semiconductor cladding layer comprises an amount of chlorine in the range 80–120 ppm, preferably about 100 ppm.

6. The detector of claim 3 wherein the photoconductor layer comprises a lead-oxide layer, and wherein the semiconductor cladding layer comprises a non-stoichiometric lead-oxide layer or a lead-oxide layer doped with an element from the group selenium (Se), sulphur(S), tellurium (Te).

7. An x-ray detector for detecting an incident x-ray image produced in an x-ray examination apparatus, the x-ray detector comprising:

a planar scatter grid including a regular array of x-ray attenuating partitions, a plurality of sensor elements arranged in a planar matrix, the scatter grid being positioned over the sensor matrix for substantially blocking scattered x-rays from reaching the sensor elements, the sensor elements further comprising a continuous conversion layer for converting incident x-rays into low-energy radiation, and a plurality of photoelectric elements for deriving an image signal from the low-energy radiation, and wherein the conversion layer causes sufficient lateral spreading of the low-energy radiation between the photoelectric elements to reduce the spatial resolution of the sensor matrix such that the size of the smallest detectable detail in an x-ray image is larger than the distance between adjacent partitions in the scatter grid, whereby Moiré-like perturbations due to the scatter grid are substantially avoided.

8. The detector of claim 7 wherein the conversion layer comprises a caesium-iodide layer including columnar crystals, the structure of the columnar crystals being arranged to cause sufficient lateral spreading of the low-energy radiation to reduce the spatial resolution of the sensor matrix is so that the size of the smallest detectable detail in the x-ray image is larger than the distance between adjacent partitions.

9. The detector of claim 7 wherein the thickness of the conversion layer is arranged to cause sufficient lateral spreading of the low-energy radiation to reduce the spatial resolution of the sensor matrix so that the size of the smallest detectable detail in the x-ray image is larger than the distance between adjacent partitions.

10. The detector of claim 9 wherein the conversion layer comprises a caesium-iodide layer having a thickness larger than 500 $\mu$m.

11. The detector of claim 7 wherein the conversion layer further comprises a diffusive reflector layer on the face of the conversion layer facing the scatter grid, the diffusive reflector layer being arranged to cause sufficient lateral spreading of the low-energy radiation to reduce the spatial resolution of the sensor matrix so that the size of the smallest detectable detail in the x-ray image is larger than the distance between adjacent partitions.

12. The detector of claim 11 wherein the diffusive reflector layer comprises a titanium-oxide ($TiO_2$) layer.

13. The detector of claim 8 wherein the thickness of the conversion layer is arranged to cause sufficient lateral spreading of the low-energy radiation to reduce the spatial resolution of the sensor matrix so that the size of the smallest detectable detail in the x-ray image is larger than the distance between adjacent partitions.

14. The detector of claim 13 wherein the conversion layer comprises a caesium-iodide layer having a thickness larger than 500 $\mu$m.

15. An x-ray examination apparatus comprising:

an x-ray source for producing an x-ray image by irradiating a patient to be examined with x-rays, and an x-ray detector for detecting the x-ray image, wherein the x-ray detector has the structure claimed in claim 7.

* * * * *